United States Patent
Chen et al.

(10) Patent No.: US 10,390,454 B2
(45) Date of Patent: Aug. 20, 2019

(54) VERTICAL ADJUSTABLE CABLE MANAGEMENT ARM

(71) Applicant: QUANTA COMPUTER INC., Taoyuan (TW)

(72) Inventors: Chao-Jung Chen, Taoyuan (TW); Chih-Hsiang Lee, Taoyuan (TW); Chih-Wei Lin, Taoyuan (TW); Wei-Chih Yang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/901,315

(22) Filed: Feb. 21, 2018

(65) Prior Publication Data

US 2019/0090378 A1 Mar. 21, 2019

Related U.S. Application Data

(60) Provisional application No. 62/561,040, filed on Sep. 20, 2017.

(51) Int. Cl.
   *H05K 7/00* (2006.01)
   *H05K 7/18* (2006.01)
   *H05K 7/14* (2006.01)

(52) U.S. Cl.
   CPC ............ *H05K 7/18* (2013.01); *H05K 7/1491* (2013.01)

(58) Field of Classification Search
   None
   See application file for complete search history.

(56) References Cited

U.S. PATENT DOCUMENTS

| 6,327,139 | B1* | 12/2001 | Champion | H02B 1/202 174/69 |
| 6,972,949 | B1 | 12/2005 | Helgenberg et al. | |
| 8,730,678 | B1* | 5/2014 | Cunningham | H05K 7/1491 174/72 A |
| 9,304,556 | B2* | 4/2016 | Jau | G06F 1/18 |

(Continued)

FOREIGN PATENT DOCUMENTS

| TW | 201347647 A | 11/2013 |
| TW | 201434224 A | 9/2014 |

OTHER PUBLICATIONS

TW Office Action for Application No. 107117617 dated Dec. 22, 2018, w/ First Office Action Summary.

(Continued)

*Primary Examiner* — Courtney L Smith
*Assistant Examiner* — Rashen E Morrison
(74) *Attorney, Agent, or Firm* — Nixon Peabody LLP; Zhou Lu

(57) ABSTRACT

An equipment rack with a compact adjustable cable management arm is disclosed. The equipment rack includes a plurality of chassis slots arranged vertically. Each chassis slot is operable to hold at least one removable electronic device. A pair of side rails supports the plurality of chassis slots. An adjustable cable management arm is located on one end of the side rails. The adjustable cable management arm has at least a first vertical position allowing access to one of the chassis slots. The adjustable cable management arm has a second vertical position allowing access to another of the chassis slots blocked by the cable management arm when the cable management arm is in the first vertical position.

12 Claims, 7 Drawing Sheets

(56) References Cited

U.S. PATENT DOCUMENTS

| | | | |
|---|---|---|---|
| 9,781,857 B2* | 10/2017 | Jau | G06F 1/183 |
| 9,832,904 B1* | 11/2017 | Giroux | H05K 7/1489 |
| 9,894,793 B1* | 2/2018 | Babcock | H05K 7/1491 |
| 2002/0181197 A1* | 12/2002 | Huang | G11B 33/128 |
| | | | 361/679.39 |
| 2003/0026084 A1 | 2/2003 | Lauchner | |
| 2011/0051341 A1* | 3/2011 | Baldassano | G02B 6/4452 |
| | | | 361/679.02 |
| 2011/0069436 A1* | 3/2011 | Jian | G06F 1/181 |
| | | | 361/679.02 |
| 2012/0134099 A1* | 5/2012 | Zhang | G06F 1/184 |
| | | | 361/679.37 |
| 2012/0293932 A1* | 11/2012 | Jai | H05K 7/1491 |
| | | | 361/679.02 |
| 2013/0168509 A1 | 7/2013 | Chen et al. | |
| 2013/0301225 A1 | 11/2013 | Gong et al. | |
| 2013/0342990 A1* | 12/2013 | Jau | G06F 1/18 |
| | | | 361/679.39 |
| 2014/0001314 A1 | 1/2014 | Gong et al. | |
| 2014/0097000 A1 | 4/2014 | Lin et al. | |
| 2016/0186895 A1* | 6/2016 | Chen | F16L 3/015 |
| | | | 248/68.1 |
| 2016/0215904 A1* | 7/2016 | Chen | H02G 3/32 |
| 2018/0224621 A1* | 8/2018 | Campbell | H04Q 1/02 |

OTHER PUBLICATIONS

TW Search Report for Application No. 107117617 dated Dec. 22, 2018, w/ First Office Action.
Extended European Search Report for EP Application No. 18180440.2, dated Jan. 11, 2019.

* cited by examiner

VERTICAL ADJUSTABLE CABLE MANAGEMENT ARM

PRIORITY CLAIM

The present application claims priority to U.S. Provisional Application No. 62/561,040, filed on Sep. 20, 2017. The entirety of that application is hereby incorporated by reference.

TECHNICAL FIELD

The present disclosure relates generally to a cable management arm, and more specifically to a cable management arm that may be adjusted vertically to allow access to rack components.

BACKGROUND

The emergence of the cloud for computing applications has increased the demand for off-site installations, known as data centers, that store data and run applications accessed by remotely connected computer device users. Such data centers typically have massive numbers of servers, switches, and storage devices to store and manage data. A typical data center has physical rack structures with attendant power and communication connections. The racks are arranged in rows throughout the room or rooms of the data center. Each rack includes a frame that has vertically oriented slots or chassis between two side walls. The slots may hold multiple network devices such as servers, switches, and storage devices. There are many such network devices stacked in such rack structures found in a modern data center. For example, some data centers have tens of thousands of servers, attendant storage devices, and network switches. Thus, a typical data center may include tens of thousands, or even hundreds of thousands, of devices in hundreds or thousands of individual racks.

An individual rack has components such as a power supply, baseboard backplanes, and physical components to hold the network devices in the slots. Network devices require cable connections to a switch or router that may be typically mounted in the top or bottom slots for maximum ease of cabling. Since there are extensive cables to connect the network devices in a rack, such cables are typically grouped together and snaked through loops in a cable management arm that is suspended on the back of the rack. Thus the cables may be physically routed and held to connect to the network devices in the rack.

In known rack designs, such a cable management arm is hinged and rotated away from the back of the rack when a network component needs servicing or replacement. In the known designs, the user releases a latch to rotate the cable management arm out to avoid interference from the arm when accessing the network devices held by the rack. However, in the densely packed space in data centers, there may be space limitations that prevent the cable management arm to be fully rotated away from the back of the rack. In such circumstances, the replacement or servicing of network devices in the rack is difficult or impossible because of the interference of the cable management arm. Efficient service or replacement of network devices is essential for the peak operation of a data center. Delays because of difficulties to access network devices in racks impede the efficient operation of the data center.

Thus, there is a need for a cable management arm that allows easy access to network devices held in an equipment rack. There is also a need for a cable management arm that may be moved in different vertical positions to allow the service of network devices in a confined space.

SUMMARY

One disclosed example is an equipment rack. The equipment rack includes a plurality of chassis slots arranged vertically. Each chassis slot is operable to hold at least one removable electronic device. A pair of side rails supports the plurality of chassis slots. An adjustable cable management arm is located on one end of the side rails. The adjustable cable management arm has at least a first vertical position allowing access to one of the chassis slots. The adjustable cable management arm has a second vertical position allowing access to another of the chassis slots blocked by the cable management arm, when the cable management arm is in the first vertical position.

Another example is a cable management arm assembly for holding cables for an equipment rack having a first chassis slot and a second chassis slot. The first chassis slot and the second chassis slot are arranged vertically between two side rails. The cable management arm assembly includes a mounting tab attached to one of the side fails. A slide bracket is operable to be positioned between two vertical positions on the mounting tab relative to the first chassis slot and a second chassis slot. A support arm is coupled to the slide bracket. The support arm is substantially perpendicular to the side rails.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1A:
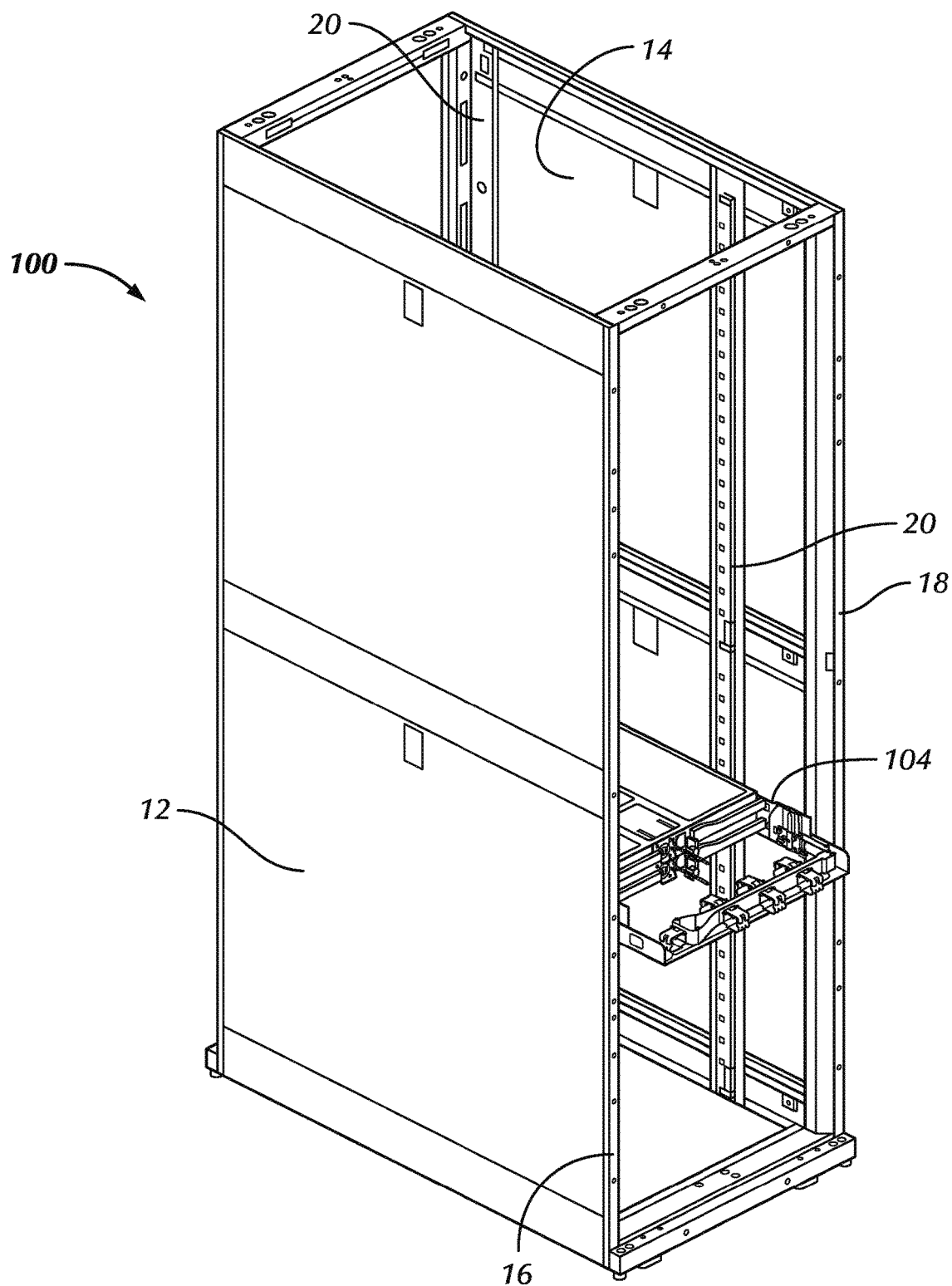
FIG. 1A is a perspective view of an equipment rack with a cable management arm.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at, near, or nearly at," or "within 3-5% of," or "within acceptable manufacturing tolerances," or any logical combination thereof, for example.

FIG. 1A shows a perspective view of an equipment rack 100. The equipment rack 100 includes a pair of side walls 12 and 14. Side frames 16 and 18 are located near the respective interior sides of the side walls 12 and 14. The side frames 16 and 18 include vertical supports 20. The vertical supports 20 near the side walls 12 and 14 support lateral side rails 102 and 104 that define slots that may hold network devices.

Figure 1B:
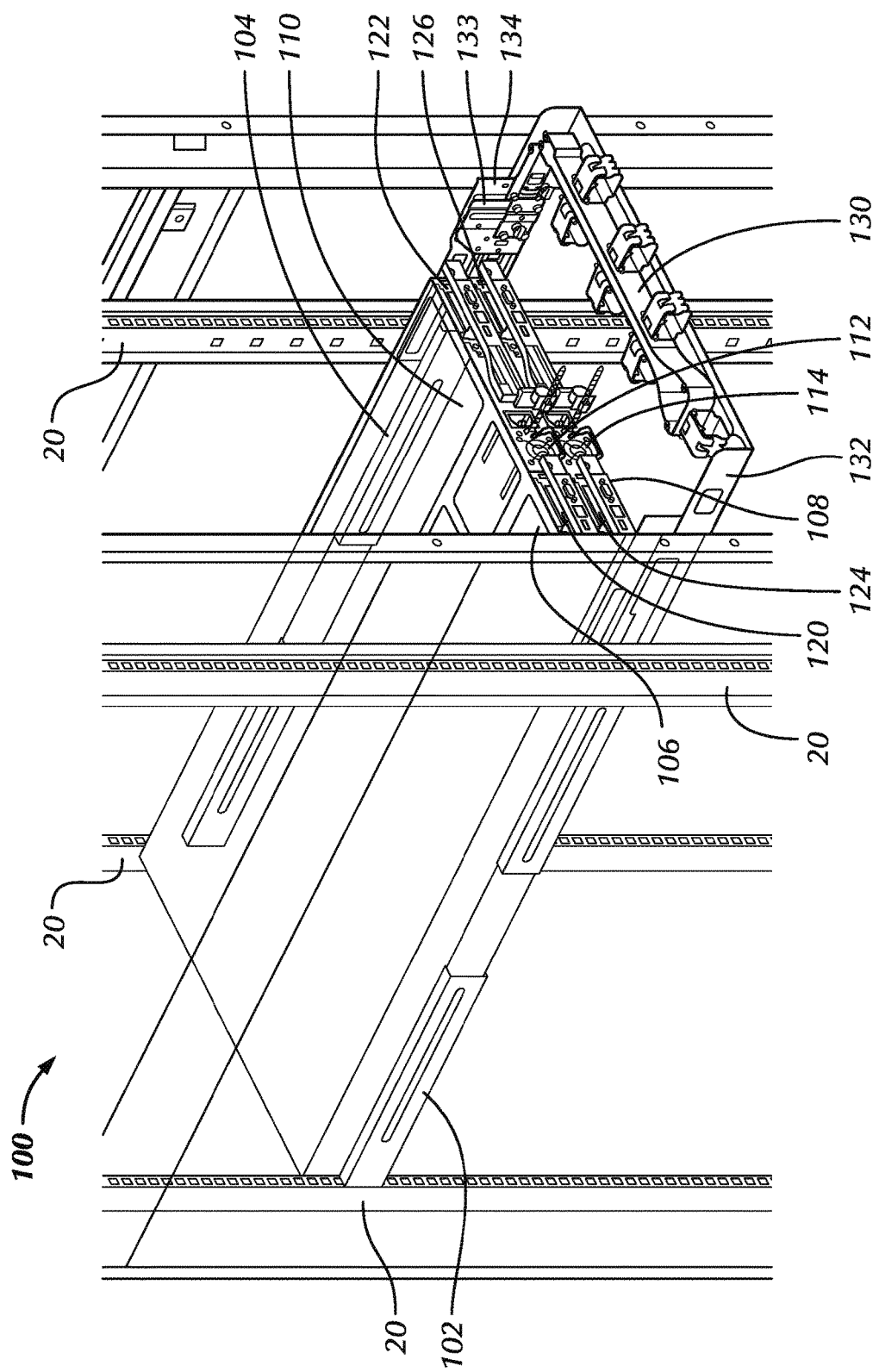
FIG. 1B is a cutaway perspective view of the equipment rack in FIG. 1A showing network devices in one of the slots.

FIG. 1B shows a close-up perspective view of the side rails 102 and 104 of the equipment rack 100. Individual slots such as a chassis slot 106 and a chassis slot 108 are formed by cross members 110, 112, and 114 that are supported by the side rails 102 and 104. The chassis slots 106 and 108 are therefore defined by the side rails 102 and 104 and cross members 110, 112, and 114. The chassis slots 106 and 108 may include connections for power for network devices as well as backplane electronics for operating network devices. The chassis slot 106 in this example holds two network devices, such as servers 120 and 122. The chassis slot 108 also holds two network devices, such as servers 124 and 126. It is to be understood that each of the slots in the rack 100 may hold a single network device or more than two network devices. Various cables that are attached to the servers 120, 122, 124 and 126 and guided by a cable management arm 130 that is located at the rear end of the slots 106 and 108. As will be explained below, the cable management arm 130 is held by the side rails 102 and 104.

Figure 2A:
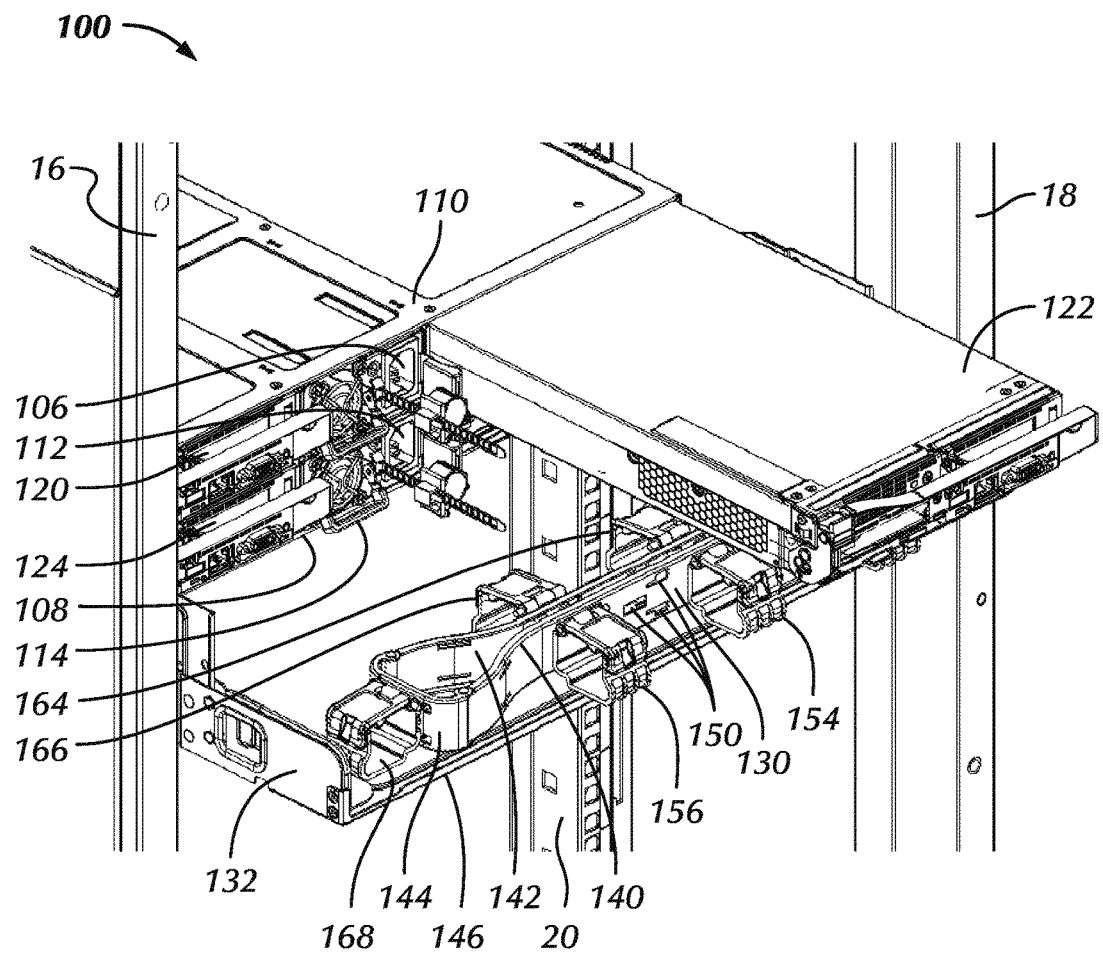
FIG. 2A is a perspective view of the back of an equipment rack with a cable management arm in one vertical position.
Figure 2B:
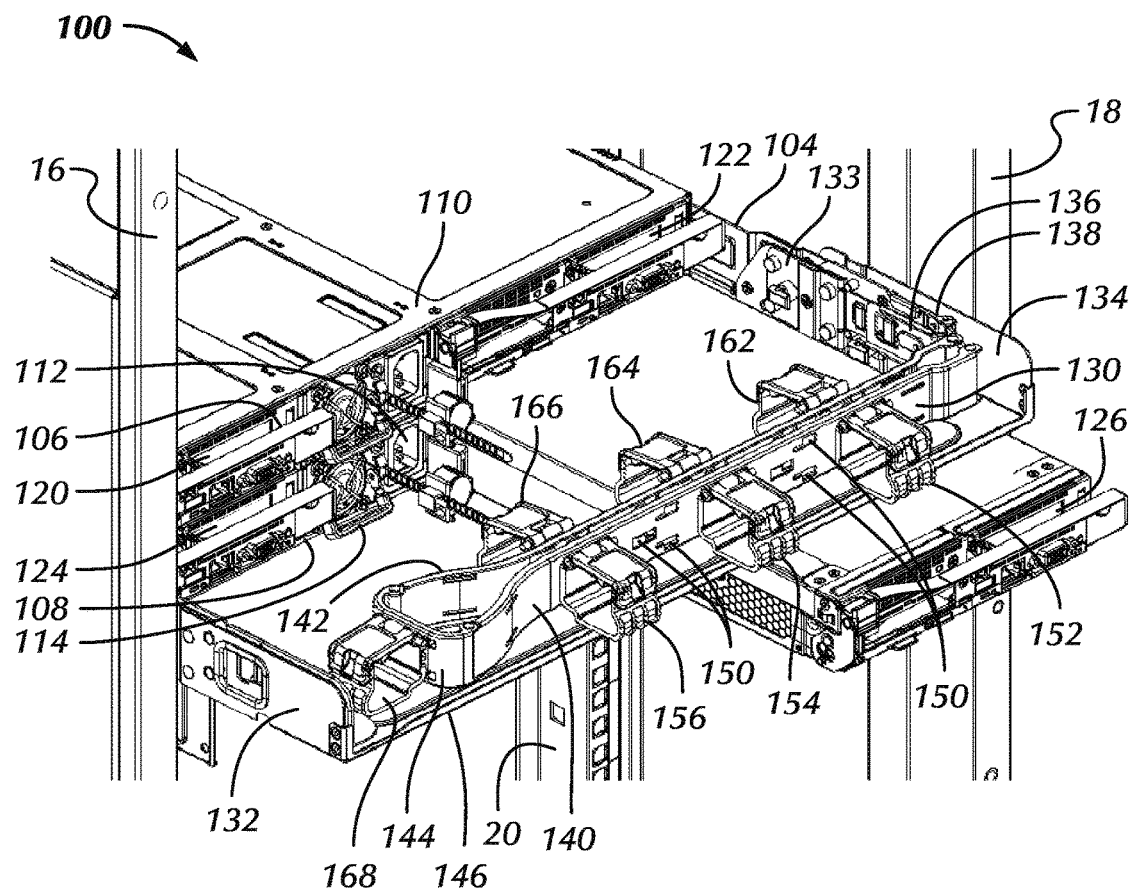
FIG. 2B is a perspective view of the back of the equipment rack with the cable management arm in FIG. 1 that is in a different vertical position.

FIGS. 2A and 2B show perspective views of the back side of an equipment rack 100 with the cable management arm 130 being suspending in different positions. Like elements from FIGS. 1A and 1B are labeled identically in FIGS. 2A and 2B. The cable management arm 130 is suspended in a lower vertical position, as shown in FIG. 2A and an upper vertical position, as shown in FIG. 2B. The ability to position the cable management arm 130 in different vertical positions prevents the need to swing out the cable management arm away from the equipment rack 100 to gain access to the slots 106 and 108. This allows the rack 100 to be installed in a more compact manner since less space is needed behind the rack 100. As shown in FIG. 2A, when the cable management arm 130 is in a lower vertical position, equipment in the chassis slot 106 may be accessed. As shown in FIG. 2B, when the cable management arm 130 is in an upper vertical position, equipment in the chassis slot 108 may be accessed.

As shown in FIGS. 2A and 2B, the network devices 120, 122, 124, and 126 may be serviced by sliding out the device from the respective slot by moving the cable management arm 130 vertically. For example, the server 122 is shown in a position removed from the chassis slot 106 in FIG. 2A. Similarly, the server 126 in FIG. 2B is shown removed from the chassis slot 108. In this manner, a technician may service the network device such as the server 126 at the rack. Alternatively, the server 126 may be removed entirely and replaced with another device; or may be repaired remotely from the equipment rack 100 and replaced at a later time.

Each of the servers 120, 122, 124, and 126 have multiple ports that accept connectors that are attached to cables that carry data signals to and from other devices, such as switches or routers. Such switches and routers may be installed in other slots in the equipment rack 100, or may be installed in proximity to the equipment rack 100. The cables from the ports of network devices in one or more slots may be bunched together to save space in the back of the equipment rack 100. Mechanisms, such as the cable management arm 130, hold bunches of cables in relation to the network devices in the slots 106 and 108.

As shown in FIGS. 2A and 2B, the cable management arm 130 extends across the back side of the equipment rack 100 and is spaced away from the chassis slots 106 and 108. As shown in FIGS. 1B, 2A and 2B, the cable management arm 130 has a mounting bracket 132 that are is attached to the rear end the side rail 102. The cable management arm 130 also has an inside mounting bracket 133 attached to the rear end of the side rail 104 as shown in FIGS. 1B and 2B. An outside mounting bracket 134 supports two linking brackets 136 and 138 that extend out parallel to the side rail 104. Each of the linking brackets 136 and 138 is attached to the proximal ends of an outside lateral main bracket 140 and an inside main bracket 142. The lateral main brackets 140 and 142 each have distal ends that are connected together in a loop shaped end structure 144. The mounting brackets 132 and 134 are also attached to a bottom support bracket 146. The bottom support bracket 146 thus extends across the rails 102 and 104. The bottom support bracket 146 allows a user to easily lift the cable arm 130 between vertical positions.

Each of the main brackets 140 and 142 has a number of slots 150. The slots 150 are formed in different locations on each of the main brackets 140 and 142. For example, the slots 150 may be located at different heights on each of the main brackets 140 and 142. The slots 150 may also be located at different locations between the distal end attached to the ends of the linking plates 136 and 138, and the end structure 144. The slots 150 may be mated with hook shaped projections on rectangular loop members to fix the rectangular loop members on the main brackets 140 and 142. Mechanisms other than a slot and a hook may be used to attach the rectangular loop members on the main brackets 140 and 142. A cable or bunches of cables are inserted through the rectangular loop members to assist in holding bunches of cables together and support the cables that are connected to the network devices in the slots of the equipment rack 100. The vertical and horizontal location of the rectangular loop members on the main brackets 140 and 142 may be determined by selecting the appropriate slots 150 on the main brackets 140 and 142 for attaching the rectangular loop members.

In this example, loop members 152, 154, and 156 are mounted on slots on the main bracket 140. Similarly, loop members 162, 164, and 166 are mounted on the main bracket 142. A distal loop 168 is mounted at the end structure 144. As explained above, the number of loops mounted on the main brackets 140 and 142 may differ or loops may be installed only on one of the main brackets 140 and 142. Further, the relative vertical and horizontal locations of each loop may be changed by moving the loop to different slots 150 on the main brackets 140 and 142. The locations of the slots 150 on the main brackets 140 and 142 allow a user to arrange the loop members to support cables in different locations relative to network devices, such as the network devices 120, 122, 126 and 128, in different chassis slots of the equipment rack 100.

As will be explained below, the cable management arm 130 may be positioned vertically relative to the slots 106 and 108. FIG. 2A shows the cable management arm 130 positioned in a vertical position on a plane with the chassis slot 108. When the cable management arm 130 is in the position in FIG. 2A, access to devices in the chassis slot 106 is allowed. Further, devices in the chassis slot 106 may be pulled out from the back of the equipment rack 100 (as shown by the server 122 being pulled out of the chassis slot 106), without interference from the cable management arm 130. FIG. 2B shows the cable management arm 130 positioned in a vertical position on a plane with the chassis slot 106, allowing access to devices in the chassis slot 108. Thus, devices in the chassis slot 108 may be pulled out from the back of the equipment rack 100, as shown by the server 126 being pulled out of the chassis slot 108, without interference from the cable management arm 130.

Figure 3A:
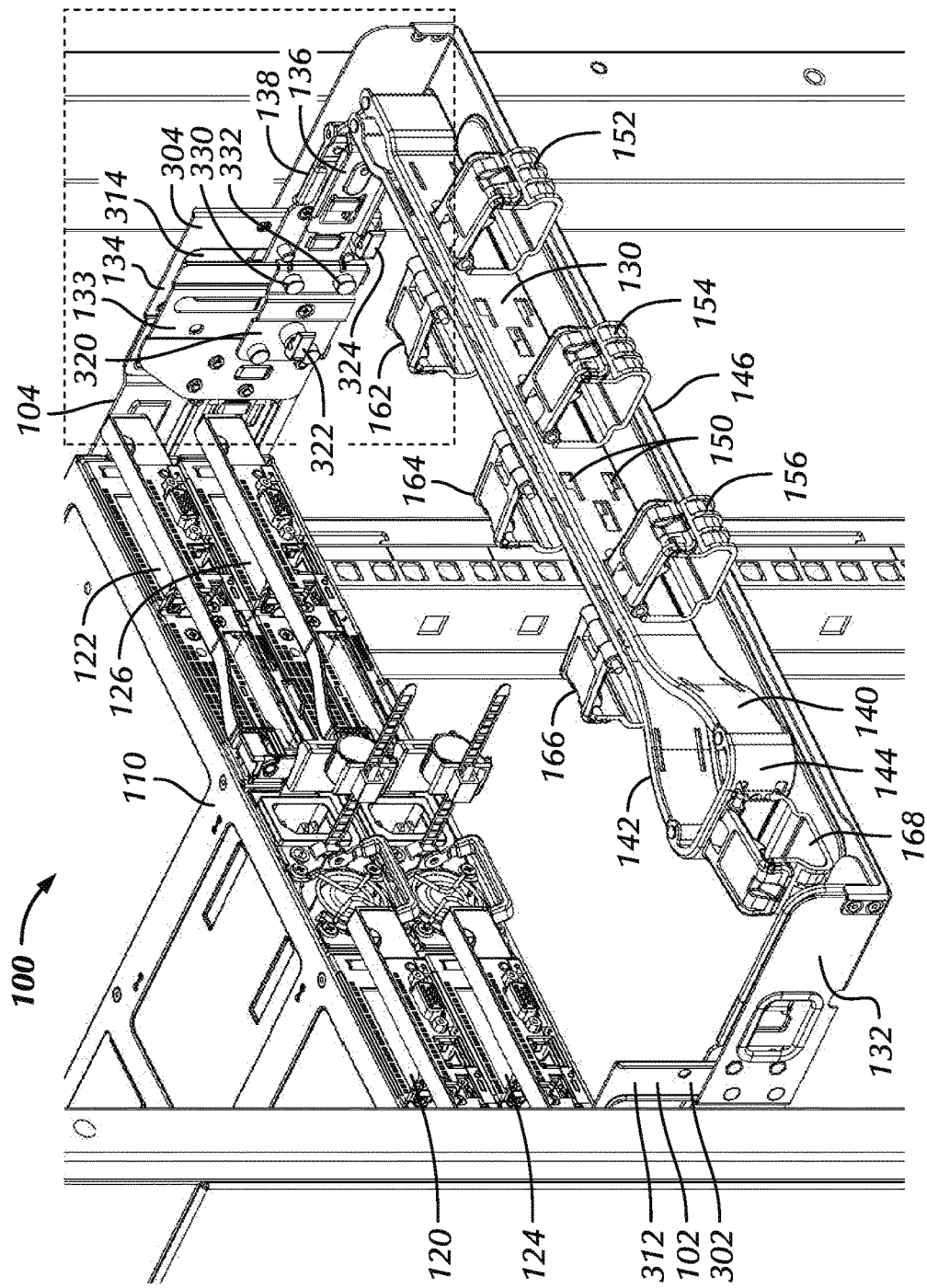
FIG. 3A is a side close up view of the attachment of the cable management arm in FIG. 1 to the equipment rack.
Figure 3B:
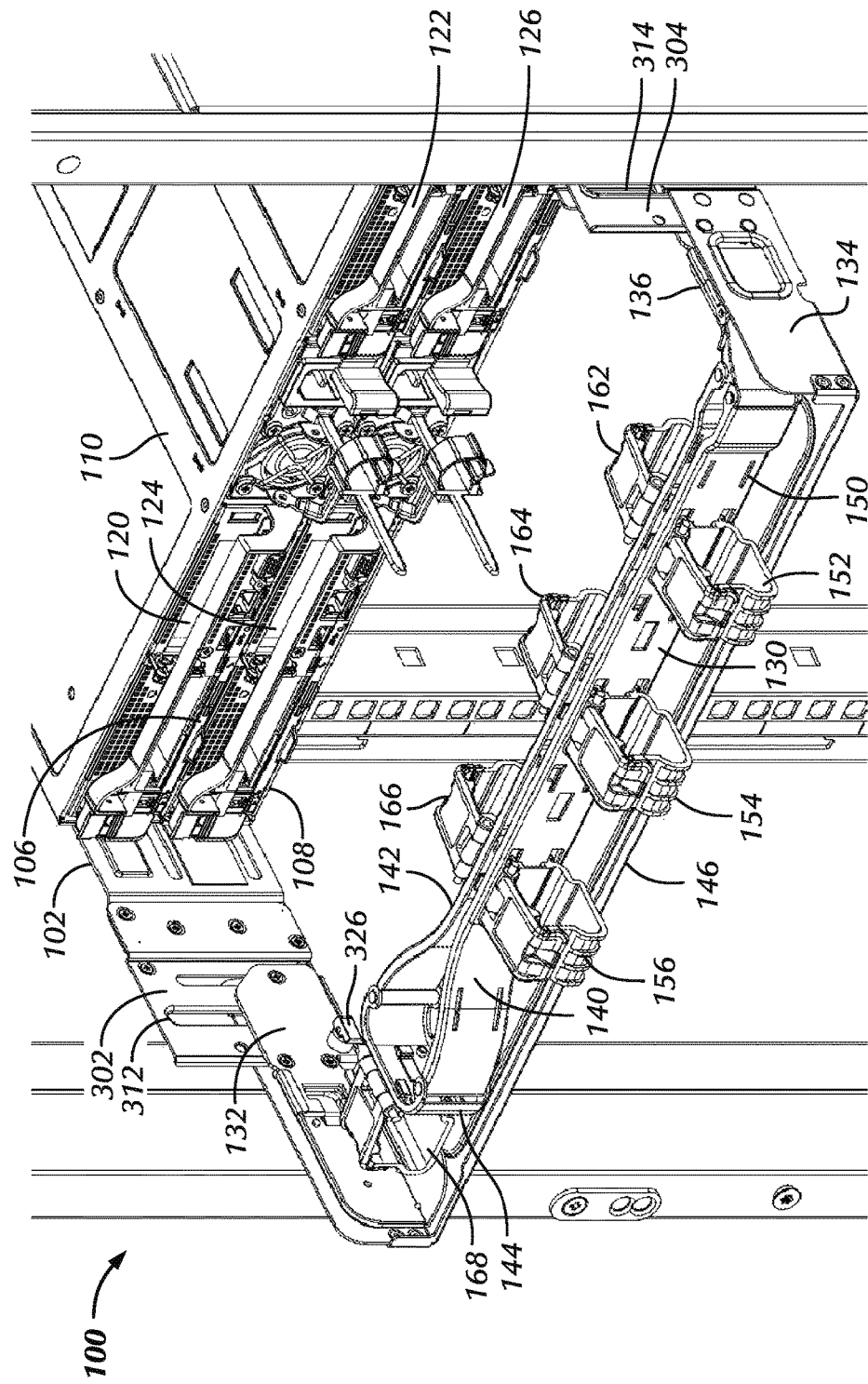
FIG. 3B is another side close up view of the attachment of the cable management arm in FIG. 1 to the equipment rack from the opposite side of the view in FIG. 3A.

FIG. 3A is a close up view of the attachment of the cable management arm 130 to the side rail 104 viewed from one side of the equipment rack 100. FIG. 3B is a close up view of the attachment of the cable management arm 130 to the side rail 102 viewed from the opposite side of the equipment rack 100. Like elements in FIGS. 3A and 3B are labeled with like reference numbers as their counterparts in FIGS. 1-2. The side rails 102 and 104 each include respective mounting tabs 302 and 304 that are attached to the ends of the respective side rails 102 and 104. In this example the mounting tabs 302 and 304 are bolted to the ends of the side rails 102 and 104. The mounting bracket 133 is bolted on the mounting tab 304. Other methods of joining the mounting brackets such as screws, rivets, and welding may be used to attach the mounting bracket 133 and mounting tabs 302 and 304. The mounting tab 302 includes a vertically oriented slot 312. A pin (not shown) extending from the mounting bracket 132 is inserted in the slot 312 and allows the mounting bracket 132 to be moved up and down in the slot 312.

The mounting tab 304 has a slot 314. A slide bracket 320 can be articulated up and down the slot 314. The slide bracket 320 includes a pair of locking knobs 322 and 324. The mounting bracket 132 also includes a rotating knob 326. The slide bracket 320 also includes drive pins 330 and 332. The drive pins 330 and 332 are inserted in the slot 314 and may be moved vertically within the slot 314. The locking knobs 322, 324, and 326 may be actuated to a locked position thereby locking the slide bracket 320 and the mounting bracket 132 (and therefore the cable management arm 130) in a vertical position in the slots 312 and 314. Actuating the locking knobs 322, 324, and 326 to a release position, allows the slide bracket 320 and the mounting bracket 134 to be articulated vertically allowing movement of the cable management arm 130. In this example, each of the locking knobs 322, 324, and 326 have a pivoting wrench mechanism. The wrench may be pivoted between a vertical position and a horizontal position relative to the top of the locking knob. When the wrench is in the vertical position it retracts a press-in type pin into the locking knob thus providing the release position. When the wrench is moved to the horizontal position, it extends the press-in pin and therefore provides the locked position. In this example, the slots 312 and 314 have vertical dimensions that allow the cable management arm 130 to be positioned at the same level as the slot 106 at the top of the slots 312 and 314 or at the same level as the slot 108 when positioned at the bottom of the slots 312 and 314. Of course the slots 312 and 314 may have different vertical dimensions that would allow the cable management arm 130 to be positioned between other slots in the equipment rack 100.

Figure 4:
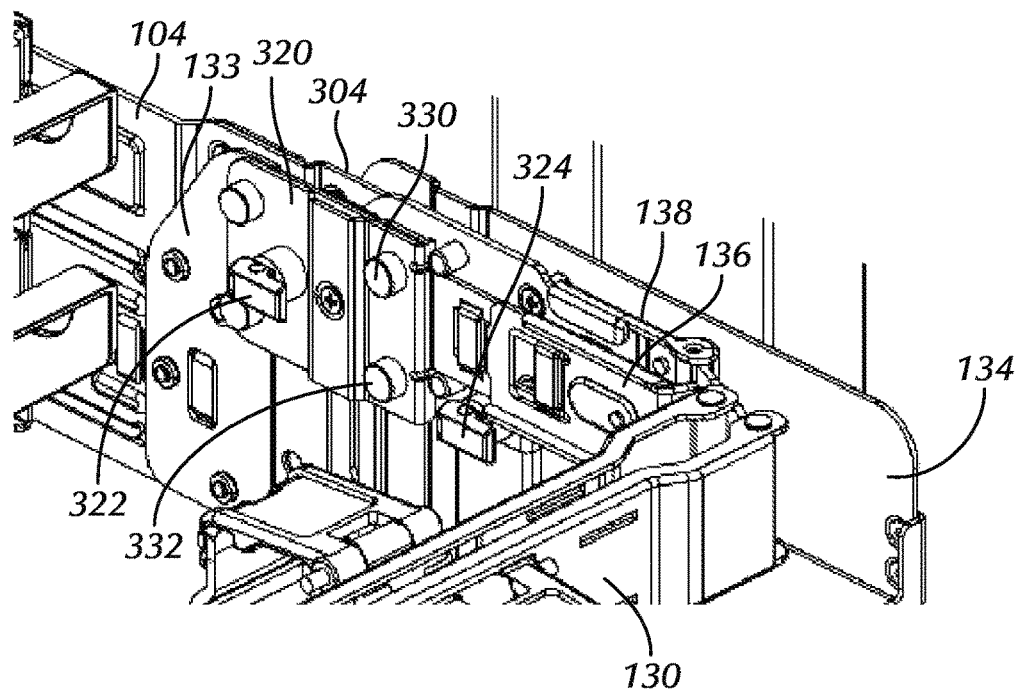
FIG. 4 is a close up view of the bracket of the cable management arm in an upper vertical position.
Figure 5:
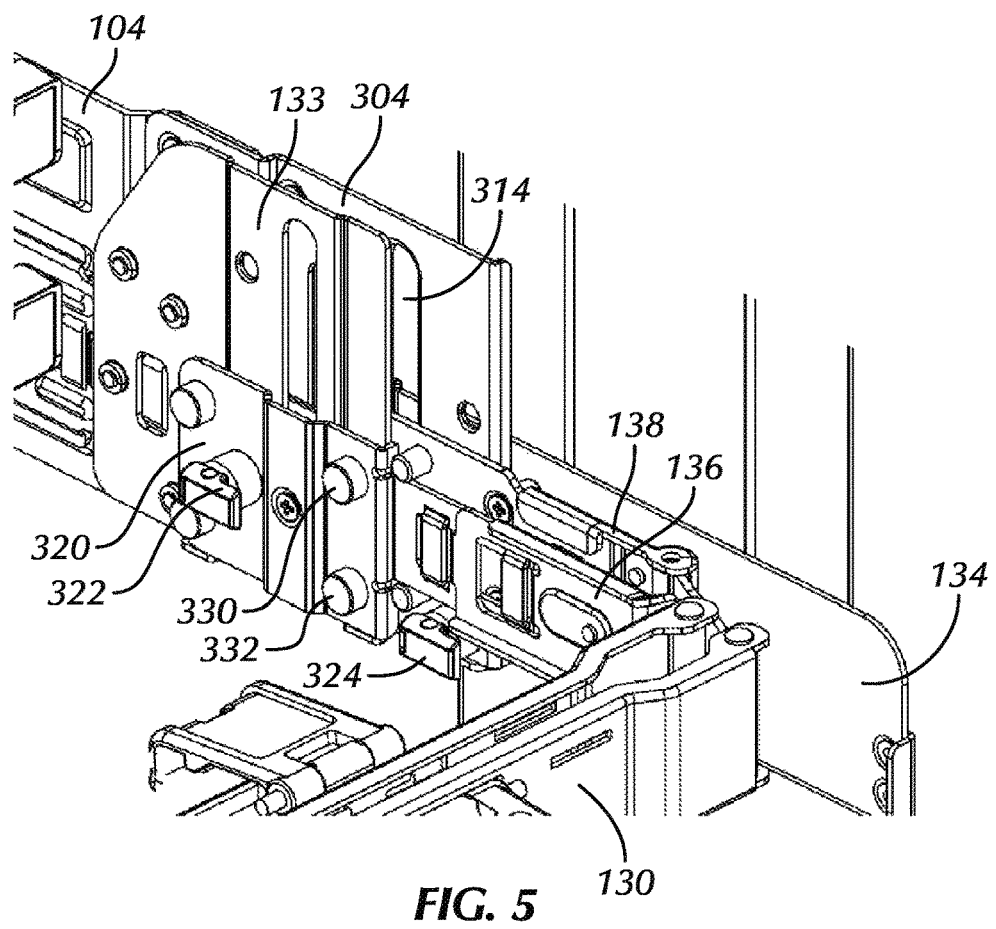
FIG. 5 is a close up view of the bracket of the cable management arm in a lower vertical position.

FIGS. 4-5 are close-up views of the dashed box area in FIG. 3A. The cable management arm 130 is in a first position on the plane of the chassis slot 106 in FIG. 4. The cable management arm 130 is adjusted to a second position on the plane of the chassis slot 108 in FIG. 5. Like elements in FIGS. 4-5 are labeled with like reference numbers as their counterparts in FIGS. 1-3. As may be seen in FIGS. 4-5, the slide bracket 320 may be moved within the slot 314 by the drive pins 330 and 332. The slide bracket 320 is locked in place by rotating the knobs 322 and 324. As shown in FIG. 4, the cable management arm 130 may be locked in the upper end of the slot 314 by knobs 322 and 324 being rotated to a locked position. The attached linking brackets 136 and 138 and main brackets 140 and 142 are thus suspended in position. As shown in FIG. 2B, since the cable management arm 130 is at the same plane as the chassis slot 106, the servers 124 and 126 in the lower chassis slot 108 may be accessed. In order to move the cable management arm 130 vertically, the knobs 322, 324, and 326 in FIGS. 3A-3B are rotated to the unlocked position. The cable management arm 130 may be moved by means of the bottom bracket 146 shown in FIGS. 2A and 2B.

FIG. 5 shows the slide bracket 320 moved to the lower position of the slot 314. The knobs 322 and 324 lock the slide bracket 320 in place to the mounting tab 324, and thus the cable management arm 130 is suspended in vertical position that is level with the chassis slot 108. As shown in FIG. 2A, since the cable management arm 130 is at the same plane as the chassis slot 108, the servers 120 and 122 in the upper chassis slot 106 may be accessed. When the cable arm 130 needs to be moved into the upper position shown in FIG. 4, a user may unlock the knobs 322, 324, and 326 shown in FIGS. 3A and 3B. The user can then lift the cable management arm 130 by the bottom support bracket 146.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer; is typically of a non-transitory nature; and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media that can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including", "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations, and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An equipment rack, comprising:
   a plurality of chassis slots arranged vertically, each chassis slot able to hold at least one removable electronic device;
   a pair of side rails supporting the plurality of chassis slots; and
   an adjustable cable management arm on one end of the side rails spaced away from the chassis slots, the adjustable cable management arm having at least a first vertical position allowing access to one of the chassis slots, and a second vertical position allowing access to another one of the chassis slots blocked by the cable management arm when the cable management arm is in the first vertical position,
   wherein the cable management arm includes a slide bracket that is capable of being adjusted relative to one of the side rails,
   wherein the side rail includes a mounting tab having a vertical slot,
   wherein the mounting tab includes a pin inserted in the vertical slot of the mounting tab, wherein the pin is moveable in the slot,
   wherein the equipment rack comprises a locking mechanism on the cable management arm that locks the arm to the mounting tab to fix the cable management arm in either the first or second vertical position, and
   wherein actuating the locking mechanism to a release position allows the slide bracket and the mounting bracket to be articulated linearly allowing vertical movement of the cable management arm.

2. The equipment rack of claim 1, wherein the cable management arm has a pair of lateral brackets positioned parallel to the plurality of chassis slots.

3. The equipment rack of claim 2, wherein the pair of lateral brackets include a plurality of slots.

4. The equipment rack of claim 3, wherein a loop is held in one of the plurality of slots, the loop operable to hold cables that is connected to the at least one removable electronic device.

5. The equipment rack of claim 1, further comprising:
   two linking brackets each having a first end coupled to one of the side rails; and
   a bottom bracket coupled between a second, opposite end of each of the linking brackets.

6. A cable management arm assembly for holding cables for an equipment rack having a first chassis slot and a second chassis slot, the first chassis slot and the second chassis slot arranged vertically between two side rails, the cable management arm assembly comprising:
   a mounting tab attached to one of the rails;
   a slide bracket operable to be positioned between two vertical positions on the mounting tab relative to the first chassis slot and a second chassis slot; and
   a support arm coupled to the slide bracket, the support arm being substantially perpendicular to the side rails;
   wherein the cable management arm includes a slide bracket that is capable of being adjusted relative to one of the side rails,
   wherein the side rail includes a mounting tab having a vertical slot,
   wherein the mounting tab includes a pin inserted in the vertical slot of the mounting tab, wherein the pin is moveable in the slot,
   wherein the equipment rack comprises a locking mechanism on the cable management arm that locks the arm to the mounting tab to fix the cable management arm in either the first or second vertical position, and wherein actuating the locking mechanism to a release position allows the slide bracket and the mounting bracket to be articulated linearly allowing vertical movement of the cable management arm.

7. The assembly of claim 6, wherein the slide bracket has a pair of lateral brackets positioned parallel to first and second chassis slots.

8. The assembly of claim 7, wherein the pair of lateral brackets include a plurality of slots.

9. The assembly of claim 8, wherein a loop is held in one of the plurality of slots, the loop operable to hold cables that can be connected to a removable electronic device in one of the first and second chassis slots.

10. The assembly of claim 6, wherein the cable management arm includes a linking bracket that is capable of being adjusted relative to one of the side rails.

11. The assembly of claim 6, wherein the mounting tab includes a vertical slot, and wherein the slide bracket includes a pin inserted in the vertical slot of the support plate.

12. The assembly of claim 6, further comprising a latch mechanism on the slide bracket that locks the slide bracket to the mounting tab to fix the slide bracket in either the first or second vertical position.

\* \* \* \* \*